(12) United States Patent
Kim et al.

(10) Patent No.: US 12,057,425 B2
(45) Date of Patent: Aug. 6, 2024

(54) SEMICONDUCTOR PACKAGE

(71) Applicant: SAMSUNG ELECTRONICS CO., LTD., Suwon-si (KR)

(72) Inventors: Eunyeong Kim, Hwaseong-si (KR); Yeongseok Kim, Hwaseong-si (KR); Jihwan Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 165 days.

(21) Appl. No.: 17/540,519

(22) Filed: Dec. 2, 2021

(65) Prior Publication Data

US 2022/0367401 A1 Nov. 17, 2022

(30) Foreign Application Priority Data

May 17, 2021 (KR) .......................... 10-2021-0063086

(51) Int. Cl.
*H01L 23/00* (2006.01)
*H01L 23/498* (2006.01)
(Continued)

(52) U.S. Cl.
CPC ........ *H01L 24/17* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/32* (2013.01); *H01L 24/73* (2013.01); *H01L 24/96* (2013.01); *H01L 24/97* (2013.01); *H01L 25/0655* (2013.01); *H01L 25/0657* (2013.01); *H01L 25/105* (2013.01); *H01L 2224/16148* (2013.01);
(Continued)

(58) Field of Classification Search
CPC ......... H01L 24/16; H01L 24/17; H01L 24/32; H01L 24/73; H01L 24/96; H01L 24/97; H01L 25/0655; H01L 25/0657; H01L 23/49816; H01L 23/49822; H01L 23/49833; H10B 80/00
USPC ........................................................ 257/690
See application file for complete search history.

(56) References Cited

U.S. PATENT DOCUMENTS

| 6,613,180 B2 | 9/2003 | Sunagawa et al. |
| 2009/0069532 A1 | 3/2009 | Ahn et al. |
| 2021/0375823 A1* | 12/2021 | Hwang ............... H01L 25/0657 |

FOREIGN PATENT DOCUMENTS

| JP | 5349189 B2 | 11/2013 |
| JP | 2016-064642 A | 4/2016 |

(Continued)

*Primary Examiner* — Jasmine J Clark
(74) *Attorney, Agent, or Firm* — Fish & Richardson P.C.

(57) ABSTRACT

A semiconductor package including a base chip; a semiconductor chip having a lower surface on which connection pads are disposed, the semiconductor chip being mounted on an upper surface of the base chip; a plurality of bumps on the connection pads and electrically connecting the base chip to the semiconductor chip; an adhesive film between the base chip and the semiconductor chip and fixing the semiconductor chip to the base chip; and an encapsulant on the base chip and encapsulating the semiconductor chip, wherein the semiconductor chip includes a central portion spaced apart from the upper surface of the base chip by a first distance, and an edge portion spaced apart from the upper surface of the base chip by a second distance, the edge portion being outside of the central portion, and a ratio of the second distance to the first distance is about 0.8 to about 1.0.

20 Claims, 13 Drawing Sheets

(51) Int. Cl.
*H01L 25/065* (2023.01)
*H01L 25/10* (2006.01)

(52) U.S. Cl.
CPC .............. *H01L 2224/16227* (2013.01); *H01L 2224/16238* (2013.01); *H01L 2224/1703* (2013.01); *H01L 2224/32145* (2013.01); *H01L 2224/32225* (2013.01); *H01L 2224/73204* (2013.01); *H01L 2224/95001* (2013.01); *H01L 2225/06513* (2013.01); *H01L 2225/06517* (2013.01); *H01L 2225/06541* (2013.01); *H01L 2924/1431* (2013.01); *H01L 2924/1432* (2013.01); *H01L 2924/1434* (2013.01); *H01L 2924/3511* (2013.01)

(56) References Cited

FOREIGN PATENT DOCUMENTS

| | | | |
|---|---|---|---|
| KR | 10-2015-0138619 A | 12/2015 | |
| KR | 10-1838333 B1 | 3/2018 | |
| KR | 10-2117726 B1 | 6/2020 | |

\* cited by examiner

SEMICONDUCTOR PACKAGE

CROSS-REFERENCE TO RELATED APPLICATION

This application claims the priority and benefit of Korean Patent Application No. 10-2021-0063086, filed on May 17, 2021, in the Korean Intellectual Property Office, the disclosure of which is incorporated herein by reference in its entirety.

BACKGROUND

1. Field

Embodiments relate to a semiconductor package.

2. Description of the Related Art

According to weight reductions and increased performance in electronic devices, miniaturization and high performance may be important in a field of semiconductor packages.

SUMMARY

The embodiments may be realized by providing a semiconductor package including a base chip; a semiconductor chip having a lower surface on which connection pads are disposed, the semiconductor chip being mounted on an upper surface of the base chip; a plurality of bumps on the connection pads, the plurality of bumps electrically connecting the base chip to the semiconductor chip; an adhesive film between the base chip and the semiconductor chip, the adhesive film fixing the semiconductor chip to the base chip; and an encapsulant on the base chip, the encapsulant encapsulating the semiconductor chip, wherein the semiconductor chip includes a central portion spaced apart from the upper surface of the base chip by a first distance, and an edge portion spaced apart from the upper surface of the base chip by a second distance, the edge portion being positioned outside of the central portion, and a ratio of the second distance to the first distance is about 0.8 to about 1.0.

The embodiments may be realized by providing a semiconductor package including a base chip; a first semiconductor chip mounted on the base chip; a second semiconductor chip mounted on the first semiconductor chip; and an adhesive film between the base chip and the first semiconductor chip and between the first semiconductor chip and the second semiconductor chip, wherein a difference between a first maximum separation distance and a first minimum separation distance between the base chip and the first semiconductor chip is less than a difference between a second maximum separation distance and a second minimum separation distance between the first semiconductor chip and the second semiconductor chip.

The embodiments may be realized by providing a semiconductor package including a package substrate; an interposer substrate on the package substrate; and at least one chip structure on the interposer substrate, wherein the at least one chip structure includes a base chip, a plurality of semiconductor chips on the base chip, and an adhesive film between the base chip and the plurality of semiconductor chips, the adhesive film includes an inner portion overlapping the plurality of semiconductor chips in a direction perpendicular to an upper surface of the interposer substrate, and an outer portion protruding further than side surfaces of the plurality of semiconductor chips in a direction parallel to the upper surface of the interposer substrate, and in a direction perpendicular to the side surfaces of the plurality of semiconductor chips, a maximum width of the outer portion is about 50 μm or less.

BRIEF DESCRIPTION OF DRAWINGS

Features will be apparent to those of skill in the art by describing in detail exemplary embodiments with reference to the attached drawings in which.

DETAILED DESCRIPTION

Figure 1A:
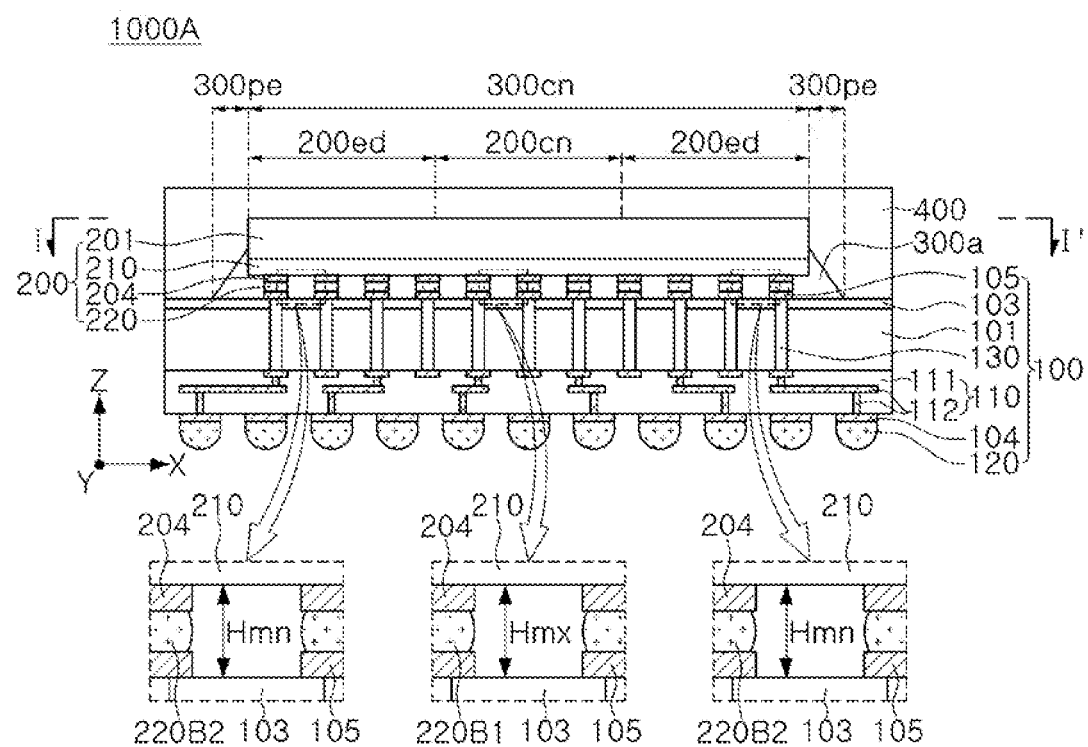
FIG. 1A is a cross-sectional view of a semiconductor package according to an example embodiment.
Figure 1B:
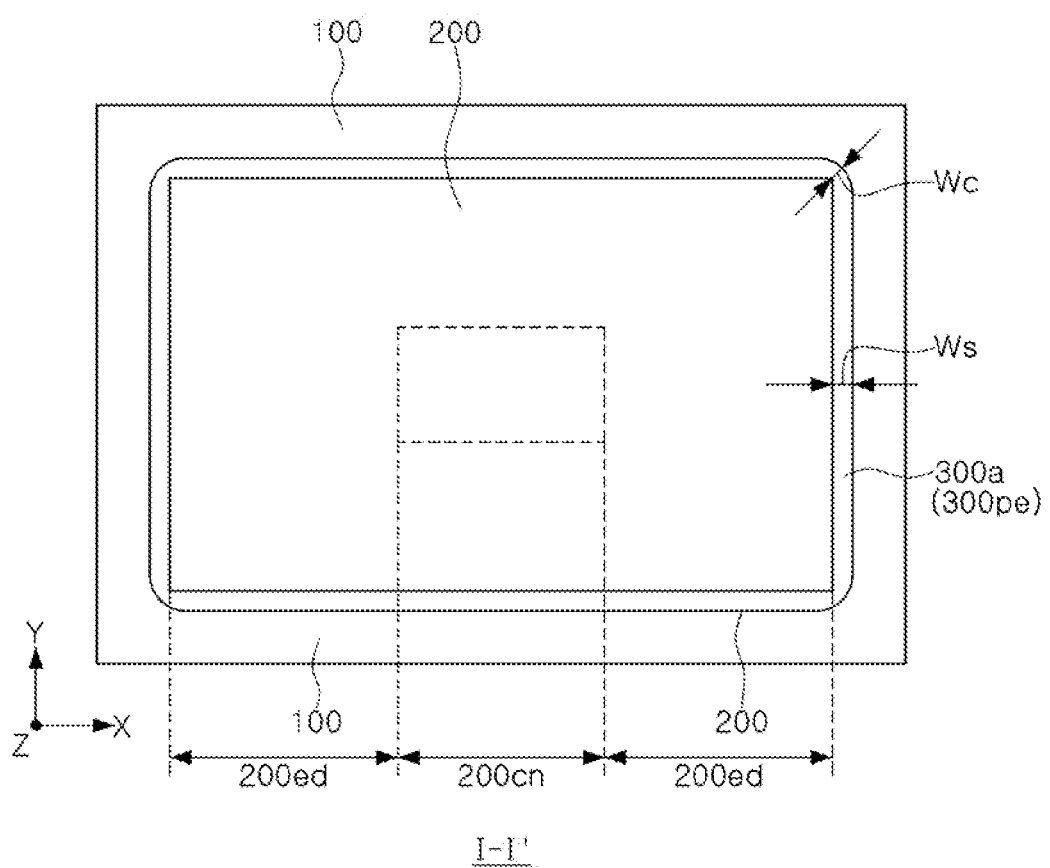
FIG. 1B is a plan view of the semiconductor package of FIG. 1A.

FIG. 1A is a cross-sectional view of a semiconductor package 1000A according to an example embodiment, and FIG. 1B is a plan view of the semiconductor package of FIG. 1A.

Referring to FIGS. 1A and 1B, a semiconductor package 1000A according to an example embodiment may include a base chip 100, a semiconductor chip 200, and an adhesive film 300a. In an implementation, the semiconductor package 1000A may further include an encapsulant 400 encapsulating the semiconductor chip 200.

The base chip 100 may include a semiconductor material such as a silicon (Si) wafer, or the like, or may be a PCB, a glass substrate, or the like that does not include a semiconductor material according to an example embodiment. In an implementation, the base chip 100 may include a substrate 101, an upper protective layer 103, an upper pad 105, a lower pad 104, an external connection terminal 120, and a through silicon via (TSV). In an implementation, when the base chip 100 is a PCB, glass substrate, or the like that does not include a semiconductor material, and the base chip 100 may not include a device layer and a TSV.

The base chip 100 may be, e.g., a buffer chip including a plurality of logic devices or memory devices in the device layer 110. In an implementation, the base chip 100 may transmit signals from the semiconductor chip 200 stacked thereon externally, and may also transmit signals and power from the outside to the semiconductor chip 200. In an implementation, the base chip 100 may perform both a logic function and a memory function through logic devices and memory devices, or the base chip 100 may only include a logic device to perform a logic function.

The substrate 101 may include, e.g., a semiconductor element such as silicon or germanium (Ge), silicon carbide (SiC), gallium arsenide (GaAs), indium arsenide (InAs), or a compound semiconductor such as indium phosphide (InP). The substrate 101 may have a silicon on insulator (SOI) structure. The substrate 101 may include a conductive region, e.g., a well doped with an impurity or a structure doped with an impurity. The substrate 101 may include various device isolation structures such as a shallow trench isolation (STI) structure.

The upper protective layer 103 may be on an upper surface of the substrate 101, and may help protect the substrate 101. In an implementation, the upper protective layer 103 may be formed of, e.g., an insulating layer such as a silicon oxide film, a silicon nitride film, or a silicon oxynitride film. In an implementation, the upper protective layer 103 may be formed of a polymer such as polyimide (PI). In an implementation, a lower protective layer may be further included on a lower surface of the device layer 110.

The upper pad 105 may be on the upper protective layer 103. The upper pad 105 may include, e.g., aluminum (Al), copper (Cu), nickel (Ni), tungsten (W), platinum (Pt), or gold (Au). In an implementation, the lower pad 104 may be below the device layer 110, and may include a material similar to that of the upper pad 105.

The device layer 110 may be on a lower surface of the substrate 101, and may include various types of devices. In an implementation, the device layer 110 may include FET such as a planar field effect transistor (FET) or a FinFET, memory devices such as a flash memory, a dynamic random access memory (DRAM), a static random access memory (SRAM), an electrically erasable programmable read-only memory (EEPROM), a phase-change random access memory (PRAM), a magnetoresistive random access memory (MRAM), a ferroelectric random access memory (FeRAM), a resistive random access memory (RRAM), or the like, logic devices such as AND, OR, NOT, or the like, and various active or passive devices such as a system large scale integration (LSI), a CMOS Imaging Sensor (CIS), or a micro-electro-mechanical system (MEMS).

The device layer 110 may include an interlayer insulating layer 111 and a multilayer wiring layer 112 on the above-described devices. The interlayer insulating layer 111 may include silicon oxide or silicon nitride. The multilayer wiring layer 112 may include multilayer wirings or vertical contacts. The multilayer wiring layer 112 may connect devices of the device layer 110 to each other, devices to a conductive region of the substrate 101, or devices to an external connection terminal 120.

The external connection terminal 120 may be on the lower pad 104, and may be connected to the wiring layer 112 or the TSV 130 inside the device layer 110. The external connection terminal 120 may be formed of a solder ball. In an implementation, the external connection terminal 120 may have a structure including a pillar and a solder. The semiconductor package 1000A may be mounted on an external substrate such as an interposer or a package substrate through the external connection terminal 120.

The through silicon via (TSV) 130 may penetrate through the substrate 101 in a vertical direction (Z direction), and provide an electrical path connecting the upper pad 105 and the lower pads 104. The TSV 130 may include a conductive plug and a barrier film surrounding the same. The conductive plug may include a metal material, e.g., tungsten (W), titanium (Ti), aluminum (Al), or copper (Cu). The conductive plug may be formed by a plating process, a PVD process, or a CVD process. The barrier film may include an insulating barrier film or a conductive barrier film. The insulating barrier film may be formed of an oxide film, a nitride film, a carbide film, a polymer, or a combination thereof. The conductive barrier film may be between the insulating barrier film and the conductive plug. The conductive barrier layer may include, e.g., a metal compound such as tungsten nitride (WN), titanium nitride (TiN), or tantalum nitride (TaN). The barrier film may be formed in a PVD process or a CVD process.

The semiconductor chip 200 may be stacked on the base chip 100, and may include a substrate 201, a device layer 210, and a bump 220. In an implementation, as illustrated in the drawing, one semiconductor chip 200 may be included or two or more semiconductor chips may be stacked on the base chip 100. The substrate 201 may have characteristics similar to those described for the substrate 101 of the base chip 100.

The device layer 210 may include a plurality of memory devices. In an implementation, the device layer 210 may include volatile memory devices such as DRAM and SRAM, or non-volatile memory devices such as PRAM, MRAM, FeRAM, or RRAM. In an implementation, in the semiconductor package 1000A, the semiconductor chip 200 may include DRAM devices in the device layer 210. In an implementation, the semiconductor package 1000A may be used for a high bandwidth memory (HBM) product, an electro data processing (EDP) product, or the like.

The device layer 210 may include a multilayer wiring layer therebelow. The multilayer wiring layer may have characteristics similar to those described for the multilayer wiring layer 112 of the device layer 110 in the base chip 100. Therefore, devices of the device layer 210 may be electrically connected to a bump 220 through the multilayer wiring layer. In an implementation, the base chip 100 may include a plurality of logic devices or memory devices in the device layer 110, and may be referred to as a buffer chip, a control chip, or the like according to its function, whereas the semiconductor chip 200 may include a plurality of memory devices in the device layer 210, and may be referred to as a core chip.

The bump 220 may be on a connection pad 204 on a lower surface of the device layer 210, and may be connected to devices of the device layer 210 through a wiring of the multilayer wiring layer. The bump 220 may electrically connect the semiconductor chip 200 and the base chip 100. In an implementation, the bump 220 may include, e.g., solder, or may include both a pillar and a solder. The pillar may have a column shape such as a cylindrical column, or a square column or an octagonal column, and may include, e.g., nickel (Ni), copper (Cu), palladium (Pd), platinum (Pt), gold (Au), or a combination thereof. Solder may have a spherical or ball shape, and may include, e.g., tin (Sn), indium (In), bismuth (Bi), antimony (Sb), copper (Cu), silver (Ag), zinc (Zn), lead (Pb), or an alloy thereof. The alloy may include, e.g., Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like. Among the plurality of bumps 220, a first bump 220B1 corresponding to or at a central portion 200$cn$ of the semiconductor chip 200 and a second bump 220B2 corresponding to or at an edge portion 200$ed$ of the semiconductor chip 200 may have different heights (e.g., in the Z direction). A height of the bump 220 may be determined according to wetting of the solder in a reflow process. In an implementation, the height of the bump 220 at the edge portion 200ed may be greater than the height of the bump 220 at the central portion 200cn, regardless of a distance between the central portion 200cn and the edge portion 200ed.

In an implementation, in attaching the base chip 100 and the semiconductor chip 200, a foil lamination process of covering semiconductor chips on a wafer (see 100w in FIG. 7A) with a foil and a pressure-reflow process may be performed, to uniformly form a gap between the base chip 100 and the semiconductor chip 200 while minimizing a fillet of the adhesive film 300a. Therefore, in the semiconductor package 1000A according to an example embodiment, wetting of the bump 220 may be improved, and yield and productivity of the package may be maximized. In an implementation, a gap between the base chip 100 and the semiconductor chip 200 may be uniformly maintained in the semiconductor package 1000A, a difference in heights between the first bump 220B1 and the second bump 220B2 may be minimized, and wetting of the second bump 220B2 may be improved. In an implementation, a difference between a first height of the first bump 220B1 and a second height of the second bump 220B2 may be about 1 μm or less, e.g., may be in a range of about 0.1 μm to about 0.9 μm.

Due to the above-described manufacturing process characteristics, the semiconductor package 1000A according to an example embodiment may have structural characteristics as described below. The stacking of the semiconductor chip 200 through the above-described foil lamination process and pressure-reflow process will be described in detail later with reference to FIGS. 7A to 7D.

In an implementation, the semiconductor chip 200 may have a central portion 200cn spaced apart from an upper surface of the base chip 100 by a first gap or first distance Hmx (e.g., in the Z direction) and an edge portion 200ed spaced apart from the upper surface of the base chip 100 by a second distance Hmn (e.g., in the Z direction). The edge portion 200ed may be located further outside of the central portion 200cn (e.g., proximate to an outer side of the semiconductor chip 200). In an implementation, a ratio of the second distance Hmn to the first distance Hmx may be, e.g., about 0.8 to about 1.0 or about 0.9 to about 1.0. In an implementation, a difference between the first distance Hmx and the second distance Hmn may be about 5 μm or less, e.g., about 1 μm or less. In an implementation, the difference between the first distance Hmx and the second distance Hmn may be about 5 μm to about 0.1 μm, or about 2 μm to about 0.1 μm. In an implementation, the first distance Hmx may be defined as a maximum separation distance between the lower surface of the semiconductor chip 200 (e.g., in the Z direction) and the upper surface of the base chip 100, and the second distance Hmn may be defined as a minimum separation distance between the lower surface of the semiconductor chip 200 and the upper surface of the base chip 100 (e.g., in the Z direction).

The adhesive film 300a may be between the base chip 100 and the semiconductor chip 200 and may surround a side surface of the bump 220 and fix the semiconductor chip 200 to the base chip 100. As shown in FIGS. 1A and 1B, the adhesive film 300a may protrude outwardly (e.g., in the X direction and Y direction) from the side surface of the semiconductor chip 200 and may cover at least a portion of the side surface of the semiconductor chip 200. In an implementation, the adhesive film 300a may be a non-conductive film (NCF), and may include, e.g., a suitable polymer film that may perform or undergo a pressure-reflow process. The pressure-reflow process may be a process of reflowing the adhesive film 300a by applying heat while maintaining constant pressure in a process chamber. The pressure applied in the pressure-reflow process may be a kind of hydrostatic pressure, and a magnitude of the pressure applied to any surface of the semiconductor chip 200 may be constant regardless of the direction.

The adhesive film 300a may have an inner portion 300cn overlapping the semiconductor chip 200 in a direction (Z direction), perpendicular to the upper surface of the base chip 100, and an outer portion 300pe protruding further than the edge portion 200ed of the semiconductor chip 200 in directions (X and Y directions), parallel to the upper surface of the base chip 100. In an implementation, the outer portion 300pe may be referred to as a fillet. A width of the outer portion 300pe may be defined as a shortest distance (e.g., in the X direction or Y direction) from one end of the outer portion 300pe to one end of a side surface of the semiconductor chip 200, or a distance perpendicular to the side surface of the semiconductor chip 200. In an implementation, the outer portion 300pe may have an inclined shape such that a width (e.g., in the X direction or Y direction) of a lower portion, adjacent or proximate to the upper surface of the base chip 100 is relatively wider than an upper portion thereof distal to the upper surface of the base chip 100. In an implementation, the width of the outer portion 300pe may be defined at a portion protruding (e.g., in the X direction or Y direction) furthest from the side surface of the semiconductor chip 200, regardless of a height from the upper surface of the base chip 100 (e.g., a maximum width in the X direction or Y direction).

In an implementation, an over-pressing phenomenon of the edge portion 200ed of the semiconductor chip 200 may be prevented by using a foil satisfying specific physical properties in the pressure-reflow process. In an implementation, in the semiconductor package 1000A, a width of the outer portion 300pe of the adhesive film 300a may be minimized. In an implementation, a maximum width of the outer portion 300pe may be about 100 μm or less, about 80 μm or less, or about 50 μm or less. In an implementation, the maximum width of the outer portion 300pe may be, e.g., about 100 μm to about 1 μm, about 50 μm to about 1 μm, or about 40 μm to about 20 μm.

In an implementation, the outer portion 300pe may have a side width Ws and a corner width Wc. The side width Ws may mean a width of the outer portion 300pe at a side portion of the semiconductor chip 100 when the semiconductor chip 200 is viewed as a rectangle or in a plan view. In an implementation, the corner width Wc may mean a width of the outer portion 300pe at a vertex or a corner portion of the semiconductor chip 200. As may be seen in FIGS. 1A and 1B, the side width Ws may be expressed as a distance from a side surface at the side of the semiconductor chip 200 in a first direction (X-axis direction) or in a second direction (Y-axis direction). In an implementation, the corner width Wc may be expressed as a distance in the X-Y direction from the side surface at the corner of the semiconductor chip 200. In an implementation, the side width Ws may be greater than the corner width Wc. This may be understood as the reason that a distance that the adhesive film 300a flows to a corner portion is longer than a distance that the adhesive film 300a flows to the side of the base chip 100. If the adhesive film 300a were not filled up to the corner portion of the semiconductor chip 200, warpage and a joint gap of the semiconductor chip could increase, and defects by not-wetting of the bump could occur. Here, the joint gap may mean a distance between the semiconductor chip and the base chip to be coupled by the bump. In an implementation, the adhesive film 300a may be sufficiently filled at the corner portion of the semiconductor chip 200. Accordingly, warpage of the semiconductor chip 200 may be suppressed and a joint gap is reduced, and wetting of the bump may be smoothly performed, such that an open defect can be greatly reduced.

The encapsulant 400 may be on the base chip 100, and may cover a portion of an upper surface of the base chip 100 and an upper surface and a side surface of the semiconductor chip 200, and a side surface of the adhesive film 300a. In an implementation, as shown in FIG. 1A, the encapsulant 400 may have a predetermined thickness and may cover the upper surface of the semiconductor chip 200. In an implementation, the encapsulant 400 may not cover the upper surface of the semiconductor chip 200. In this case, the upper surface of the semiconductor chip 200 may be exposed from or through the encapsulant 400. In an implementation, the encapsulant 400 may include, e.g., an epoxy molding compound (EMC).

The semiconductor package 1000A of the present example embodiment may be prepared using a foil lamination process, so a gap between the semiconductor chip 200 and the base chip 100 may be uniform, and in addition, a width of the outer portion 300pe of the adhesive film 300a may be minimized. Accordingly, in the semiconductor package 1000A of the present example embodiment, yield and productivity may be improved, and a height of the entire semiconductor package 1000A may also be reduced.

Figure 2:
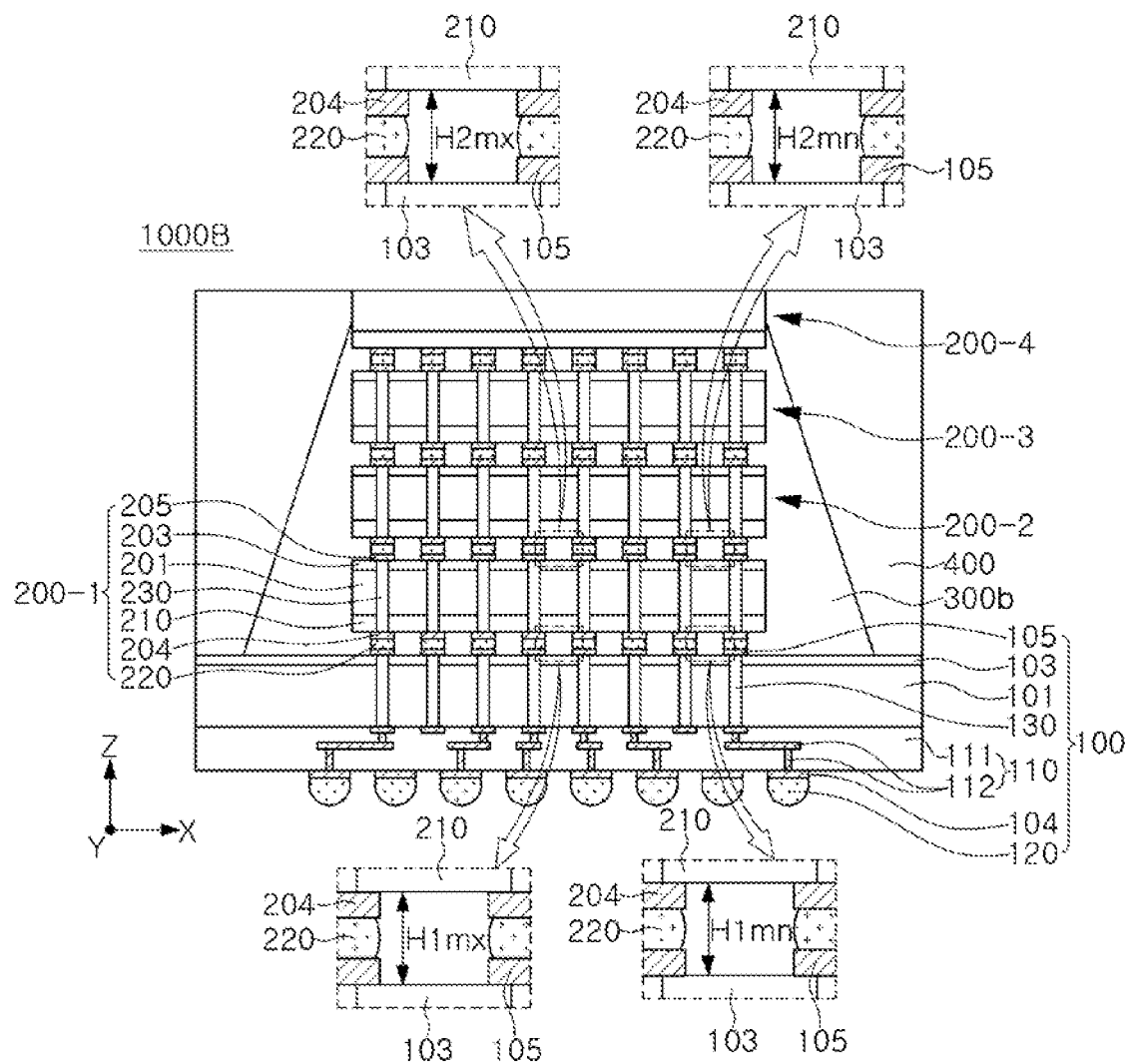
FIG. 2 is a cross-sectional view of a semiconductor package according to an example embodiment.

FIG. 2 is a cross-sectional view of a semiconductor package 1000B according to an example embodiment.

Referring to FIG. 2, the semiconductor package 1000B of the present example embodiment may have the same or similar characteristics to the semiconductor package 1000A illustrated in FIG. 1A, except that a plurality of semiconductor chips 200-1, 200-2, 200-3, and 200-4 may be stacked on the base chip 100. Accordingly, descriptions overlapping with those described with reference to FIGS. 1A and 1B may be omitted.

In the semiconductor package 1000B according to the present example embodiment, e.g., first to fourth semiconductor chips 200-1, 200-2, 200-3, and 200-4 may be stacked on the base chip 100, and the first to third semiconductor chips 200-1, 200-2, and 200-3 may be electrically connected to each other through a TSV 230. In an implementation, the number of semiconductor chips 200 stacked on the base chip 100 may be two, three, or five or more.

Each of the first to fourth semiconductor chips 200-1, 200-2, 200-3, and 200-4 may include a memory chip, similar to the semiconductor chip 200 described with reference to FIGS. 1A and 1B. In an implementation, each of the first to third semiconductor chips 200-1, 200-2, 200-3, and 200-4 may include an upper protective layer 203 and an upper pad 205 on an upper surface of the substrate 201, and a TSV 230 penetrating through the substrate 201, and the fourth semiconductor chip 200-4 may not include an upper protective layer 203, an upper pad 205, and a TSV 230. In an implementation, an upper surface of the fourth semiconductor chip 200-4 may not be covered by an encapsulant 400, or the upper surface of the fourth semiconductor chip 200-4 may be covered by the encapsulant 400.

The first semiconductor chip 200-1 may be stacked on the base chip 100 through a bump 220 and an adhesive film 300b. Each of the second to fourth semiconductor chips 200-2, 200-3, and 200-4 may be stacked on the corresponding semiconductor chip through the bump 220 and the adhesive film 300b. In an implementation, the second semiconductor chip 200-2 may be stacked on the first semiconductor chip 200-1, the third semiconductor chip 200-3 may be stacked on the second semiconductor chip 200-2, and the fourth semiconductor chip 200-4 may be stacked on the third semiconductor chip 200-3 through the bump 220 and the adhesive film 300b.

In an implementation, the adhesive film 300b may have an integrated structure. In an implementation, a portion ('lower adhesive film') of the adhesive film 300b between the first semiconductor chip 200-1 and the base chip 100 and a portion ('upper adhesive film') of the adhesive film 300b between other semiconductor chips may not be distinguished from each other (e.g., may be a one-piece or monolithic structure). As described above, the integrated structure of the adhesive film 300b may be implemented in such a manner that semiconductor chips are sequentially stacked on the base chip 100 in a form of a wafer, and all of the stacked semiconductor chips are laminated with foil, and then a pressure-reflow process is performed. The integrated structure of the adhesive film 300b will be described later with reference to FIGS. 7A to 7D.

In an implementation, a protruding portion of the adhesive film 300b may have a shape that has a constant inclination and becomes wider toward a lower portion. In an implementation, the protruding portion of the adhesive film 300b may have a curved shape. However, even in the case of the curved shape, similarly to the inclined shape, the protruding portion of the adhesive film 300b may generally have a wide width in the lower portion, and a narrow width in the upper portion (e.g., may have a tapered shape).

The semiconductor package 1000B of the present example embodiment may also be due to a foil lamination process, so that a gap between the base chip 100 and the semiconductor chips 200-1, 200-2, 200-3, and 200-4 may maintain the gaps between the base chip 100 and the semiconductor chips 200-1, 200-2, 200-3, and 200-4 may maintain a uniform height to some extent. In an implementation, a difference between a first maximum separation distance H1$mx$ and a first minimum separation distance H1$mn$ between the base chip 100 and the first semiconductor chip 200-1 may be smaller than a difference between a second maximum separation distance H2$mx$ and a second minimum separation distance H2$mn$ between the first semiconductor chip 200-1 and the second semiconductor chip 200-2. In an implementation, a ratio of the first minimum separation distance H1$mn$ to the first maximum separation distance H1$mx$ may be about 0.8 to about 1.0, and a ratio of the second minimum separation distance H2$mn$ to the second maximum separation distance H2$mx$ may be about 0.6 to about 1.0, or about 0.6 to about 0.8. In an implementation, the first maximum separation distance H1$mx$ and the first minimum separation distance H1$mn$ may be about 8 μm to about 10 μm, and the second maximum separation distance H2$mx$ and the second minimum separation distance H2$mn$ may be about 8 μm to about 12 μm. The first maximum separation distance H1$mx$ and the first minimum separation distance H1$mn$, described above, may be defined as a separation distance (in the Z direction) between the upper surface of the base chip 100 and the lower surface of the first semiconductor chip 200-1, and the first maximum separation distance H2$mx$ and the second minimum separation distance H2$mn$ may be defined as a separation distance (in the Z direction) between an upper surface of the first semiconductor chip 200-1 and a lower surface of the second semiconductor chip 200-2. In an implementation, a difference between the first maximum separation distance H1$mx$ and the first minimum separation distance H1$mn$ may be smaller than a difference between the second maximum separation distance H2$mx$ and the second minimum separation distance H2$mn$.

Figure 3:
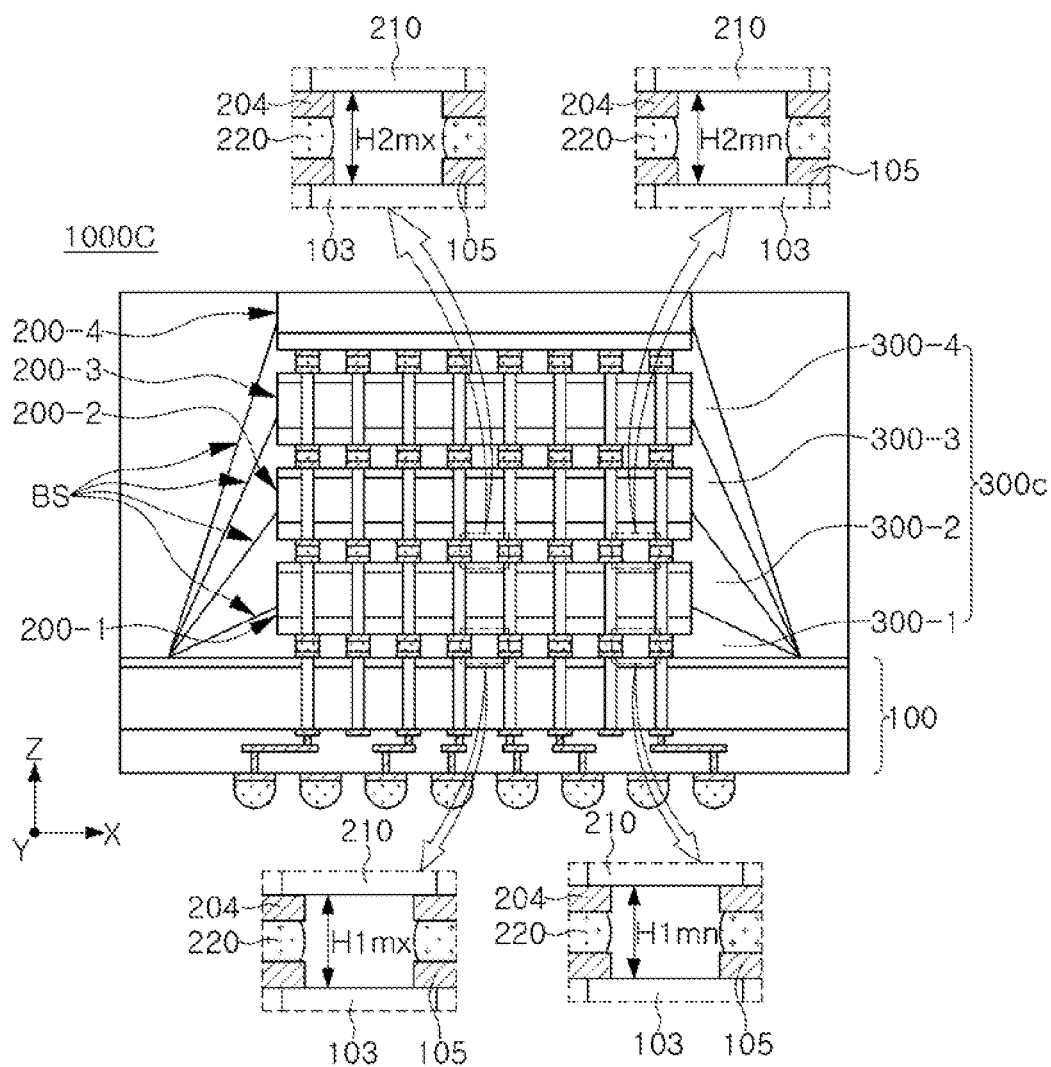
FIG. 3 is a cross-sectional view of a semiconductor package according to an example embodiment.

FIG. 3 is a cross-sectional view of a semiconductor package 1000C according to an example embodiment.

Referring to FIG. 3, the semiconductor package 1000C according to an example embodiment may have the same or similar characteristics to the semiconductor package 1000B illustrated in FIG. 2, except for a shape of an adhesive film 300c. Accordingly, descriptions overlapping with those described with reference to FIG. 2 may be omitted. In an implementation, in the semiconductor package 1000C, the adhesive film 300c may be divided into four adhesive film portions 300-1, 300-2, 300-3, and 300-4. The adhesive film 300c may include a first adhesive film portion 300-1 between the first semiconductor chip 200-1 and the base chip 100, a second adhesive film portion 300-2 between the second semiconductor chip 200-2 and the first semiconductor chip 200-1, a third adhesive film portion 300-3 between the third semiconductor chip 200-3 and the second semiconductor chip 200-2, and a fourth adhesive film portion 200-4 between the fourth semiconductor chip 200-4 and the third semiconductor chip 200-3. In an implementation, each of the first adhesive film portion to the fourth adhesive film portion 300-1, 300-2, 300-3, and 300-4 may be distinguished or distinct from an adjacent adhesive film portion, e.g., through a boundary surface BS. An individual structure of the adhesive film 300c may be implemented by stacking four semiconductor chips, respectively, in such a manner that one semiconductor chip is stacked on a base chip 100 in a form of a wafer and the semiconductor chip is laminated with foil, and then a pressure-reflow process is performed, and another semiconductor chip is stacked on a semiconductor chip again, and the semiconductor chip is laminated with foil, and then a pressure-reflow process is performed.

In an implementation, each of the protruding portions of the adhesive film 300c may have a shape that has a certain inclination and becomes wider toward the bottom, or each of the protruding portions of the adhesive film 300c may have a curved shape. However, even in the case of the curved shape, similarly to the inclined shape, each of the protruding portions of the adhesive film 300c may generally have a wide width in a lower portion and a narrow width in an upper portion. In an implementation, a width of a lower surface of each of the protruding portions of the adhesive film 300c may be substantially the same, or may be narrowed in order of the first adhesive film portion 300-1, the second adhesive film portion 300-2, the third adhesive film portion 300-3, and the fourth adhesive film portion 300-4. In an implementation, as illustrated in FIG. 3, a width of an outer portion of the adhesive film 300c may be defined by the first adhesive film portion 300-1, or when the second adhesive film portion 300-2 protrudes the most from the semiconductor chips 200-1, 200-2, 200-3, and 200-4, the width of the outer portion of the adhesive film 300c may be defined by the second adhesive film portion 300-2.

Figure 4A:
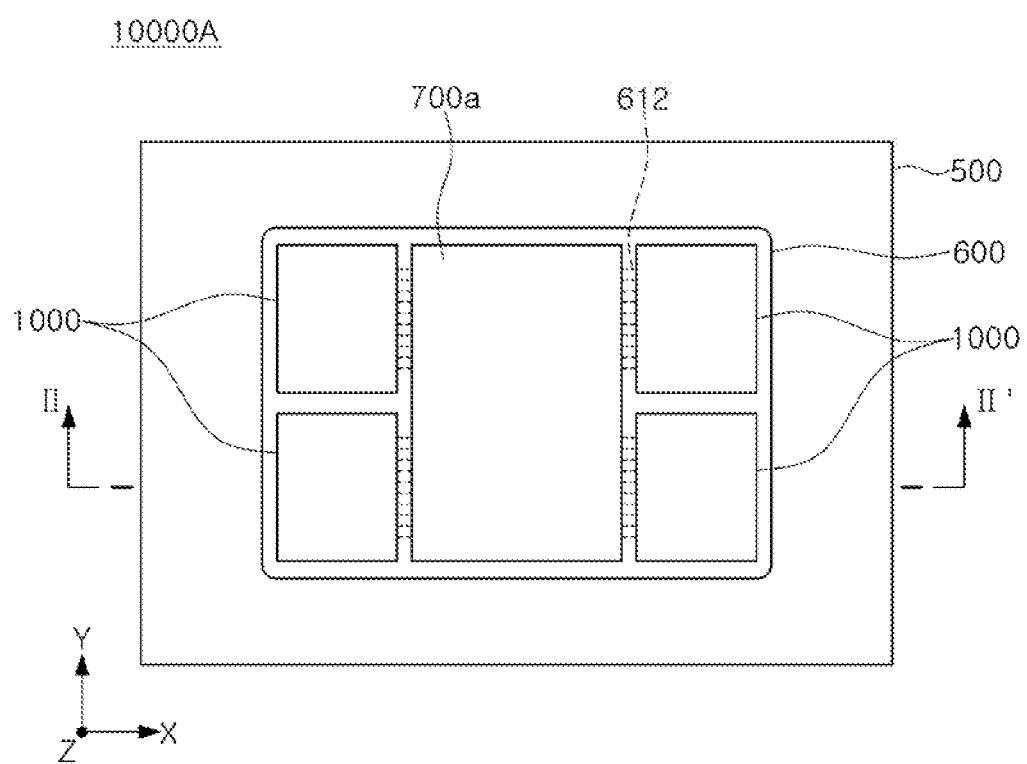
FIG. 4A is a plan view of a semiconductor package according to an example embodiment.
Figure 4B:
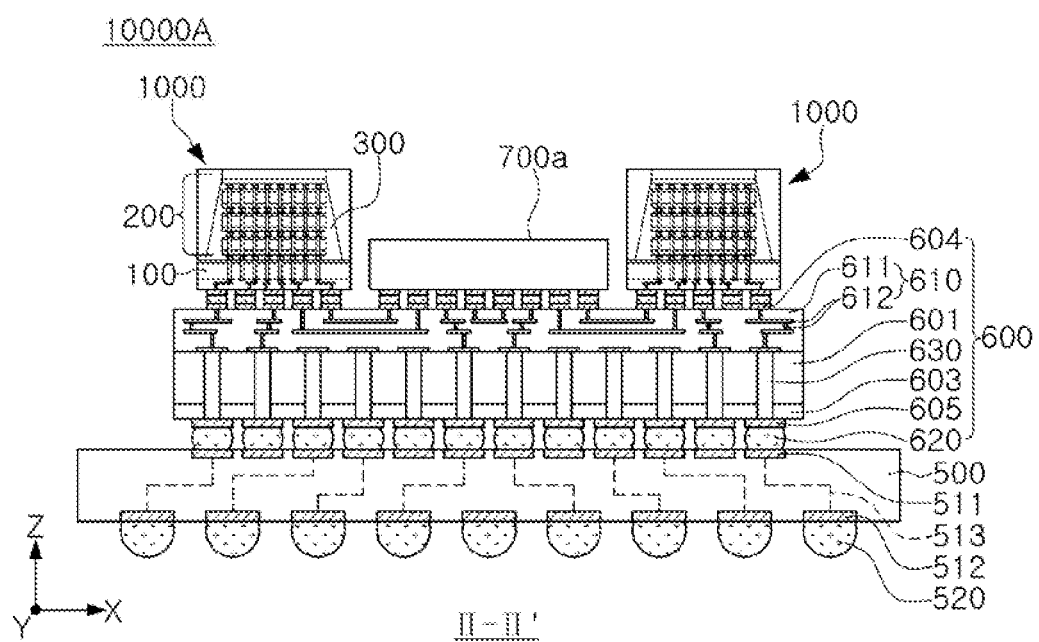
FIG. 4B is a cross-sectional view taken along line II-II' of FIG. 4A.

FIG. 4A is a plan view of a semiconductor package 10000A according to an example embodiment, and FIG. 4B is a cross-sectional view taken along line II-II' of FIG. 4A.

Referring to FIGS. 4A and 4B, a semiconductor package 10000A according to an example embodiment may include a package substrate 500, an interposer substrate 600, and at least one chip structure 1000. In an implementation, the semiconductor package 10000A may further include a logic chip or a processor chip 700, adjacent to the chip structure 1000, on the interposer substrate 600.

The package substrate 500 may include a lower pad 512 on a lower surface of a body, an upper pad 511 on an upper surface of the body, and a redistribution circuit 513 electrically connecting the lower pad 512 to the upper pad 511. The package substrate 500 is a support substrate on which the interposer substrate 600, the logic chip 700, and the chip structure 1000 may be mounted, and may be a substrate for a semiconductor package including a printed circuit board (PCB), a ceramic substrate, a glass substrate, a tape wiring board, or the like. The body of the package substrate 500 may include different materials depending on the type of substrates. In an implementation, when the package substrate 500 is a printed circuit board, it may be a form in which a wiring layer is additionally laminated on one side or both sides of a body copper clad laminate or a copper clad laminate. A solder resist layer may be respectively formed on the lower and upper surfaces of the package substrate 500. The lower and upper pads 512 and 511 and the redistribution circuit 513 may form an electrical path connecting the lower surface and the upper surface of the package substrate 500. The lower and upper pads 512 and 511 and the redistribution circuit 513 may be formed of, e.g., a metallic material such as copper (Cu), aluminum (Al), nickel (Ni), silver (Ag), gold (Au), platinum (Pt), tin (Sn), lead (Pb), titanium (Ti), chromium (Cr), palladium (Pd), indium (In), or zinc (Zn), carbon (C), or an alloy including at least one metal or two or more metals thereof. The redistribution circuit 513 may include multiple redistribution layers and vias connecting the same. An external connection terminal 520 connected to the lower pad 512 may be on the lower surface of the package substrate 500. The external connection terminal 520 may include, e.g., tin (Sn), indium (In), bismuth (Bi), antimony (Sb), copper (Cu), silver (Ag), zinc (Zn), lead (Pb), or alloys thereof.

The interposer substrate 600 may include a substrate 601, a lower protective layer 603, a lower pad 605, a wiring layer 610, a bump 620, and a through electrode 630. The chip structure 1000 and the processor chip 700 may be stacked on the package substrate 500 via the interposer substrate 600. The interposer substrate 600 may electrically connect the chip structure 1000 and the processor chip 700 to each other.

The substrate 601 may be formed of, e.g., silicon, an organic material, plastic, or a glass substrate. When the substrate 601 is a silicon substrate, the interposer substrate 600 may be referred to as a silicon interposer. In an implementation, when the substrate 601 is an organic substrate, the interposer substrate 600 may be referred to as a panel interposer.

A lower protective layer 603 may be on a lower surface of the substrate 601, and a lower pad 605 may be on the lower protective layer 603. The lower pad 605 may be connected to the through electrode 630. The chip structure 1000 and the processor chip 700 may be electrically connected to the package substrate 500 through bumps 620 disposed on the lower pad 605.

The wiring layer 610 may be on an upper surface of the substrate 601, and may include an interlayer insulating layer 611 and a single-layer or multilayer wiring structure 612. When the wiring layer 610 has a multilayer wiring structure, wirings of different layers may be connected to each other through vertical contacts.

The through electrode 630 may extend from the upper surface to the lower surface of the substrate 601 to penetrate through the substrate 601. In an implementation, the through electrode 630 may extend inwardly of the wiring layer 610, and may be electrically connected to wirings of the wiring layer 610. When the substrate 601 is silicon, the through electrode 630 may be referred to as a TSV. Other structures and materials of the through electrode 630 are the same as those described for the semiconductor package 1000A of FIG. 1A. In an implementation, the interposer substrate 600 may include only a wiring layer therein, or may not include a through electrode.

The interposer substrate 600 may convert or transfer an input electrical signal between the package substrate 500 and the chip structure 1000 or the processor chip 700. In an implementation, the interposer substrate 600 may not include devices such as active devices or passive devices. In an implementation, the wiring layer 610 may also be below the through electrode 630. In an implementation, a positional relationship between the wiring layer 610 and the through electrode 630 may be relative.

The bump 620 may be on a lower surface of the interposer substrate 600 and may be electrically connected to a wiring of the wiring layer 610. The interposer substrate 600 may be stacked on the package substrate 500 through the bump 620. The bump 620 may be connected to the lower pad 605 through the wirings of the wiring layer 610 and the through electrode 630. In an implementation, some pads 605 used for power or ground among the lower pads 605 may be integrated and connected to the bump 620, so that the number of the lower pads 605 may be greater than the number of the bumps 620.

The logic chip or the processor chip 700 may include, e.g., a central processor (CPU), a graphics processor (GPU), a field programmable gate array (FPGA), a digital signal processor (DSP), a cryptographic processor, a microprocessor, a microcontroller, an analog-to-digital converter, an application-specific IC (ASIC), or the like. According to the types of devices included in the logic chip 700, the semiconductor package 10000 may be classified into a server-oriented semiconductor package or a mobile-oriented semiconductor package.

It may be understood that the chip structure 1000 of the present example embodiment may have the same or similar characteristics to the semiconductor packages 1000A, 1000B, and 1000C illustrated in FIG. 1A to 3. For example, the chip structure 1000 may include a base chip 100, a plurality of semiconductor chips 200 stacked on the base chip 100 in a vertical direction (Z direction), and an adhesive film 300 between the base chip 100 and the plurality of semiconductor chips 200, the adhesive film 300 may have an inner portion overlapping the plurality of semiconductor chips 200 in a direction perpendicular to an upper surface of the interposer substrate 600, and an outer portion protruding further than a side surface of the plurality of semiconductor chips 200 in directions (in X and Y directions), parallel to the upper surface of the interposer substrate 600, and in a direction (e.g., in the X direction), perpendicular to the side surface of the plurality of semiconductor chips 200, a maximum width of the outer portion may be about 50 μm or less, for e.g. about 50 μm to about 1 or about 40 μm to about 20 μm. In an implementation, a difference between a maximum separation distance and a minimum separation distance between a lowermost semiconductor chip of the plurality of semiconductor chips 200 and the base chip 100 may be about 1 μm or less, e.g., about 1 μm to about 0.1 μm.

The semiconductor package 10000A according to an example embodiment may further include an inner sealing material covering a side surface and an upper surface of the chip structure 1000 and the processor chip 700 on the interposer substrate 600. In an implementation, the semiconductor package 10000A may further include an outer sealing material covering the interposer substrate 600 and the inner sealing material on the package substrate 500. In an implementation, the outer sealing material and the inner sealing material may be formed together and may not be distinguished or may not form distinct layers. In an implementation, the inner sealing material may cover only the upper surface of the processor chip 700 and may not cover the upper surface of the chip structure 1000.

In an implementation, in the semiconductor package 10000A, the chip structure 1000 and the processor chip 700 may be attached on a wide interposer disk through a foil lamination process and a pressure-reflow processes, and then, as an individualization process for the interposer disk is performed, a structure in which the chip structure 1000 and the processor chip 700 are mounted on the interposer substrate 600 may be implemented. In this case, as described above, the semiconductor package 10000A may maintain a uniform height between the interposer substrate 600, and the chip structure 1000 and the processor chip 700, and may further include an insulating film protruding outwardly than the chip structure 100 and the processor chip 700.

Figure 5:
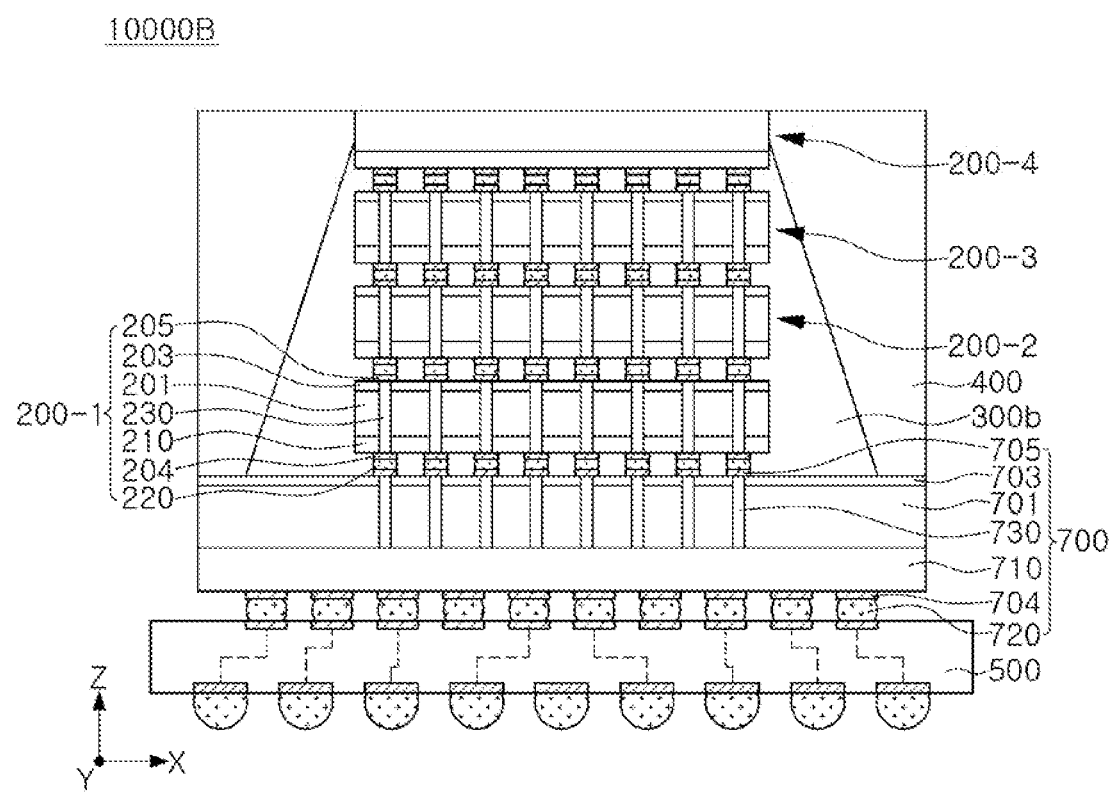
FIG. 5 is a cross-sectional view of a semiconductor package according to an example embodiment.

FIG. 5 is a cross-sectional view of a semiconductor package 10000B according to an example embodiment.

Referring to FIG. 5, it may be understood that a semiconductor package 10000B according to an example embodiment, the same or similar characteristics, as the semiconductor package 1000B shown in FIG. 2, except that a logic chip 700 and a plurality of semiconductor chips 200-1, 200-2, 200-3, and 200-4 are sequentially stacked on a package substrate 500. Accordingly, descriptions overlapping with those described with reference to FIG. 2 may be omitted.

In an implementation, the plurality of semiconductor chips 200-1, 200-2, 200-3, and 200-4 may include a memory chip, may be stacked on the logic chip 700 in a vertical direction (a Z direction), and may be electrically connected to the package substrate 500 through a through electrode 730 in the logic chip 700. In an implementation, the plurality of semiconductor chips 200-1, 200-2, 200-3, and 200-4 may also be disposed side by side in horizontal directions (X and Y direction) on an upper surface of the logic chip 700. The plurality of semiconductor chips 200-1, 200-2, 200-3, and 200-4 may be stacked on the logic chip 700 in a form of a wafer through foil lamination and pressure-reflow processes. Accordingly, the outer portion of the adhesive film 300 may be sufficiently filled up to corner portions of the plurality of semiconductor chips 200-1, 200-2, 200-3, and 200-4, and a gap between the logic chip 700 and the plurality of semiconductor chips 200-1, 200-2, 200-3, and 200-4 may be maintained uniformly, and yield and productivity of the semiconductor package 10000B may be improved.

The logic chip 700 may include elements, similar to those of the base chip 100 illustrated in FIG. 1A or the like. In an implementation, the logic chip 700 may include a substrate 701, a device layer 710, an external connection terminal 720, a through electrode 730, or the like. The logic chip 700 may include a processor chip such as a CPU or a GPU.

Figure 6A:
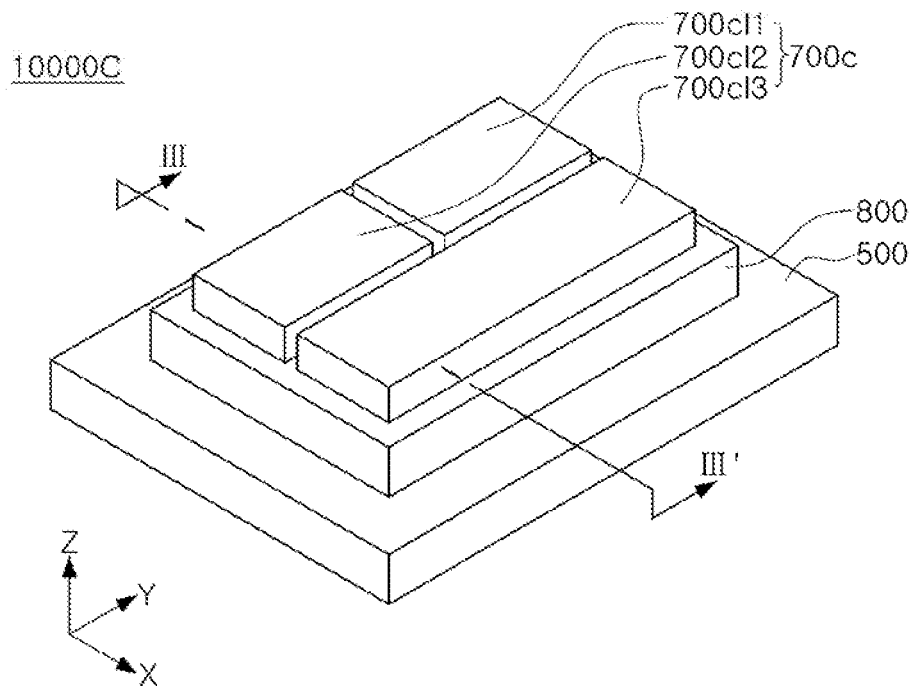
FIG. 6A is a perspective view of a semiconductor package according to an example embodiment.
Figure 6B:
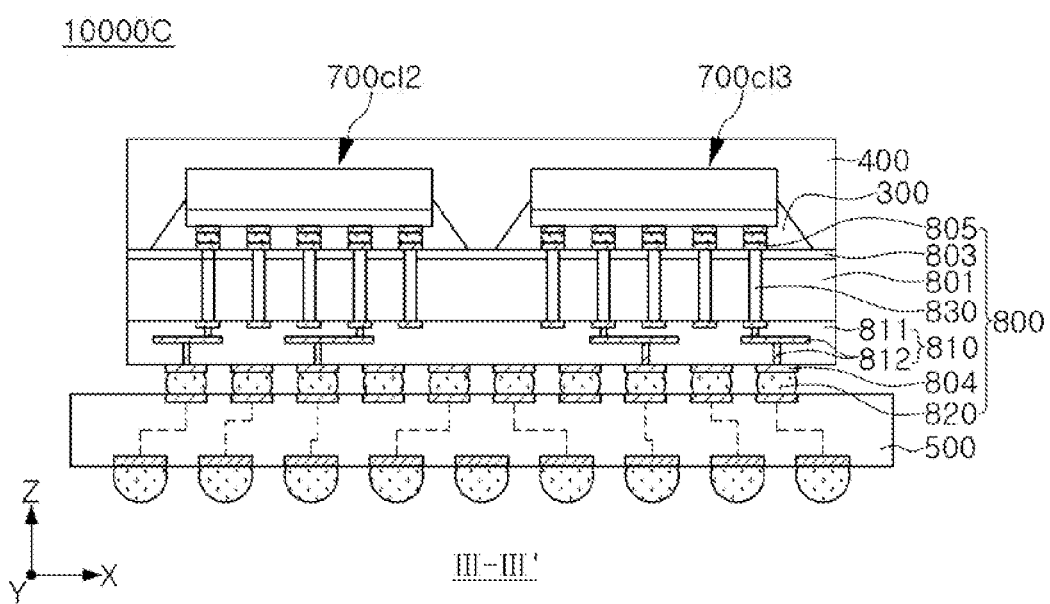
FIG. 6B is a cross-sectional view taken along line of FIG. 6A.

FIG. 6A is a perspective view of a semiconductor package 10000C according to an example embodiment, and FIG. 6B is a cross-sectional view taken along line III-III' of FIG. 6A.

Referring to FIGS. 6A and 6B, a semiconductor package 10000C according to an example embodiment may include chiplets 700c/1, 700c/2, and 700c/3, an active interposer 800, and a package substrate 500. The chiplets 100c/1, 100c/2, and 100c/3 may refer to each chip constituting a Multi-Chip Module (MCM). The MCM may be composed of I/O, CPU, GPU, a Field Programmable Gate Array (FPGA) chip, or the like. In an implementation, in FIG. 6A, the first chiplet 100c/1 may be a GPU chip, the second chiplet 100c/2 may be a CPU chip, and the third chiplet 100c/3 may be an FPGA chip. In an implementation, two or fewer or four or more chiplets may be mounted on the active interposer 800. Here, the chiplet or chiplet technology may refer to a semiconductor chip manufactured by being differentiated according to the size and function of a device or a manufacturing technology of such a semiconductor chip.

The active interposer 800 may perform a function of an I/O chip. In an implementation, the active interposer 800 may include an I/O device, a DC/DC converter, a sensor, a test circuit, or the like therein. In an implementation, the chiplets 100c/1, 100c/2, and 100c/3 and the active interposer 800 may constitute the MCM. The active interposer 800 may include elements, similar to those of the interposer substrate 600 illustrated in FIG. 4B, and a redundant description may be omitted. In an implementation, as illustrated the drawings, the active interposer 800 may be in a form of a silicon interposer substrate.

The chiplets 700c/1, 700c/2, and 700c/3 may be mounted on the active interposer 800 in a form of a wafer through foil lamination and pressure-reflow processes. In an implementation, the outer portion of the adhesive film 300 may be sufficiently filled up to corner portions of the chiplets 700c/1, 700c/2, and 700c/3, a gap between the chiplets 700c/1, 700c/2, and 700c/3 and the active interposer 800 may be maintained to be uniform, and yield and productivity of the semiconductor package 10000C may be improved.

FIGS. 7A to 7D are views of stages in a manufacturing process of a semiconductor package according to an example embodiment.

Figure 7A:
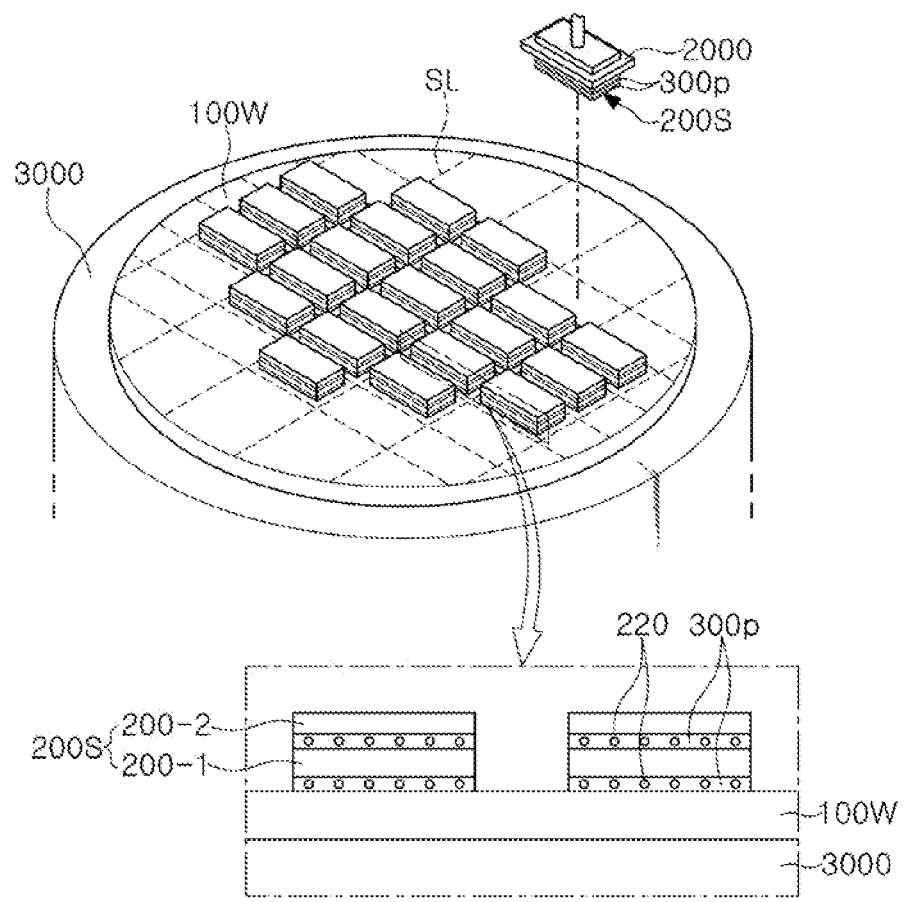
FIGS. 7A to 7D are views of stages in a manufacturing process of a semiconductor package according to an example embodiment.

Referring to FIG. 7A, first, a stacked chip 200S may be pre-bonded on a wafer 100W on an electrostatic chuck 3000 using an adhesive film 300p. The wafer 100W may include a plurality of base chips ('100' in FIG. 1A) divided by scribe lanes SL.

The stacked chip 200S may include a first semiconductor chip 200-1 and a second semiconductor chip 200-2, and an adhesive film 300p. In an implementation, in pre-bonding of the stacked chip 200S, e.g., the first semiconductor chip 200-1 may be pre-bonded on the wafer 100W, and the second semiconductor chip 200-2 may be pre-bonded again on the first semiconductor chip 200-1. In addition, in pre-bonding of the stacked chip 200S, a stacked chip 200S may be formed by pre-bonding the second semiconductor chip 200-2 on the first semiconductor chip 200-1, and then, the stacked chip 200S may be pre-bonded on the wafer 100W. The pre-bonding of the stacked chip 200S may be performed using a pick-and-place device 2000.

The adhesive film 300p may cover a bump 220 on lower surfaces of the first and second semiconductor chips 200-1 and 200-2, while having low fluidity and maintaining a solid state, in a state before a pressure-reflow process. The pick-and-place device 2000 may pick-up the first and second semiconductor chips 200-1 and 200-2 in a state to which the adhesive film 300p is attached, and may pre-bond the same on a base chip region corresponding to the wafer 100W. The adhesive film 300p may be fixed to a base chip having a certain amount of adhesive force and corresponding to the stacked chip 200S.

For reference, pre-bonding refers to a process of simply placing a semiconductor chip on a corresponding base chip without applying pressure or heat, and fixing it only with the adhesive force of the adhesive film 300p in a solid state, and may be a concept corresponding to TCB. In a manufacturing method of the semiconductor package of the present example embodiment, the TCB may be included in the pre-bonding process.

Figure 7B:
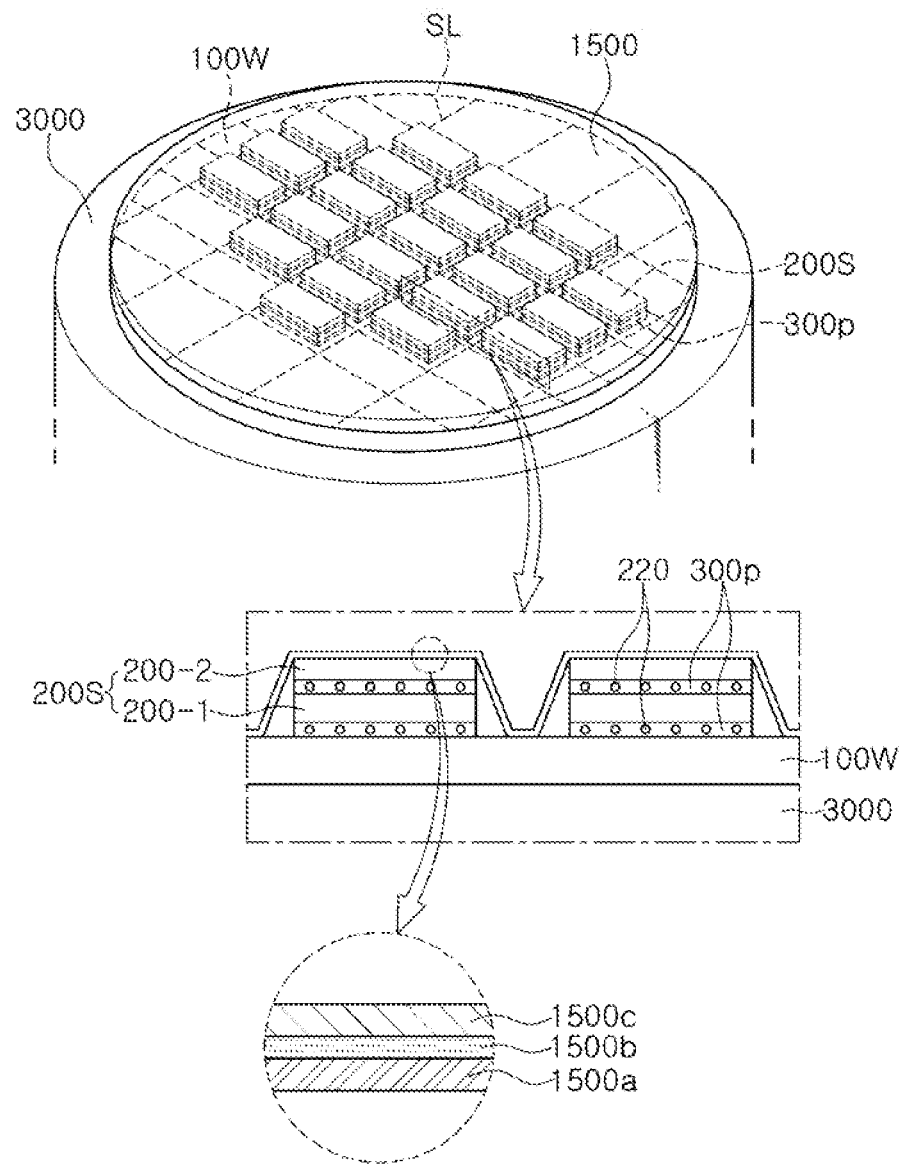

Referring to FIG. 7B, a foil lamination process of covering the entire stacked chips 200S on the wafer 100W with the foil 1500 is performed. The foil 1500 may have a form in which a cover film 1500a, an adhesive film 1500b, and a heat-resistant film 1500c are sequentially stacked. In an implementation, the adhesive film 1500b may include, e.g., a pressure sensitive adhesive, and the heat-resistant film 1500c may be, e.g., a polyimide (PI) film. In an implementation, the heat-resistant film 1500c may include various suitable polymer materials having heat resistance. In an implementation, the stacked chip 200S may be thicker than one of the semiconductor chip 200-1 and 200-2, and the foil 1500 may cover a side surface of the stacked chip 200S with a certain degree of inclination. The foil 1500 may have a size sufficient to cover all of the stacked chips 200S on the wafer 100W. In an implementation, the foil 1500 may have a size substantially the same as the wafer 100W or slightly larger than the wafer 100W.

Figure 7C:
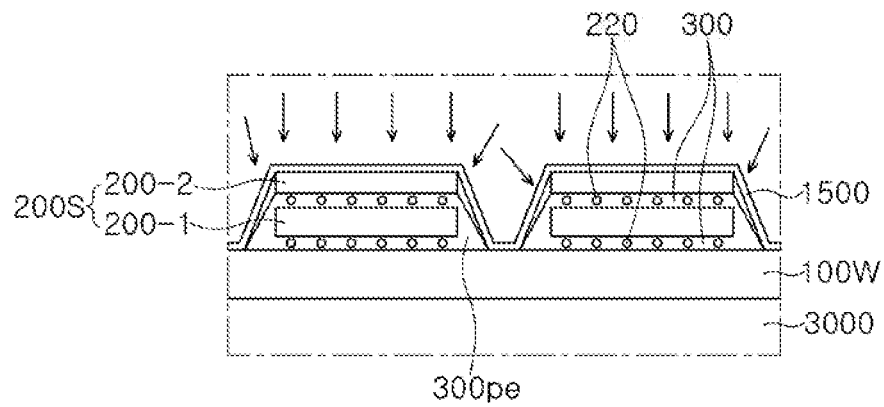

Referring to FIG. 7C, after the foil lamination process for the stacked chips 200S, a pressure-reflow process may be performed. In an implementation, in the pressure-reflow process, the applied pressure may be about 0.5 MPa to 3 MPa. In an implementation, the pressure may remain the same throughout the pressure-reflow process, or the pressure may change as the process is performed. In an implementation, as a process to suppress warpage of the stacked chips 200S is performed, pressure may increase. In the drawing, pressure applied to the foil 1500 is indicated by an arrow. The pressure applied in the pressure-reflow process may be hydrostatic pressure, and a magnitude of the pressure applied to the stacked chip 200S or any surface of the foil 1500 may be constant regardless of a direction.

In an implementation, in the pressure-reflow process, heat may be applied while changing a temperature step by step. First, in a pre-heating section (about 120° C. to about 130° C.), a trap of the adhesive film 300 in a joint boundary surface may be minimized, and a flow of the adhesive film 300 in a low-viscosity section may occur. Next, a dwelling section (about 250° C. to about 300° C.), is a peak temperature section, and in the dwelling section, curing of the adhesive film 300 may start, and wetting of the bump 220 (or solder) may be performed. Last, in a cooling section (about 80° C.), voids of the adhesive film 300 may be minimized, and may vary depending on equipment specific capabilities.

Adhesive films ('300p' in FIG. 7B) attached to each of the first semiconductor chip 200-1 and the second semiconductor chip 200-2 may be reflowed together in the pressure-reflow process, so that the adhesive films 300p may form an adhesive film 300 having an integral or monolithic structure that are not distinguished from each other.

Figure 7D:
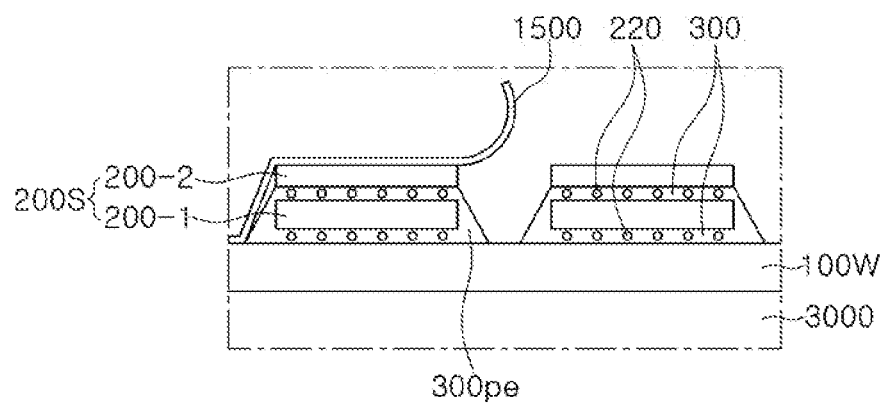

Referring to FIG. 7D, after performing the pressure-reflow process, the foil 1500 may be removed. The foil 1500 may be removed through, e.g., UV irradiation.

Thereafter, through an individualization process, a semiconductor package (see FIG. 8A) in which two semiconductor chips 200-1 and 200-2 are stacked on the base chip 100 may be completed. When four semiconductor chips are stacked on the base chip 100 through the above-described process, the semiconductor package 1000B as shown in FIG. 2 may be manufactured. The encapsulant 400 in FIG. 1A, and the like may also be formed by applying a molding material to all stacked chips on a wafer and then individualizing the same together with the base chip 100.

Figure 8A:
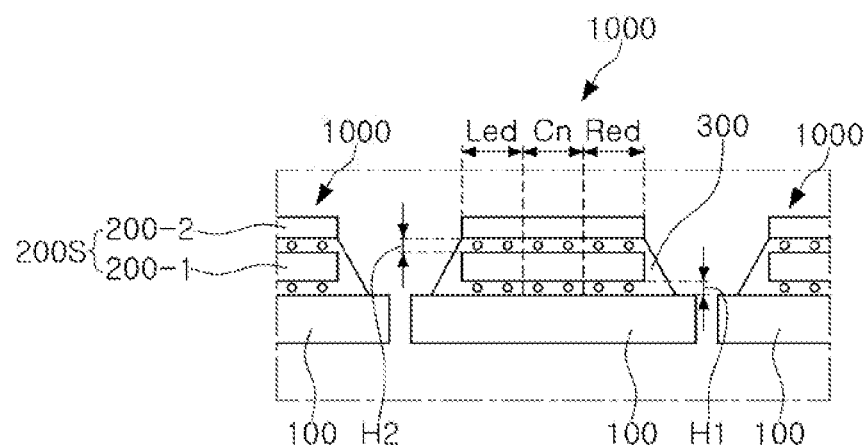
FIG. 8A is a cross-sectional view of a semiconductor package completed through the manufacturing process shown in FIGS. 7A to 7D.
Figure 8B:
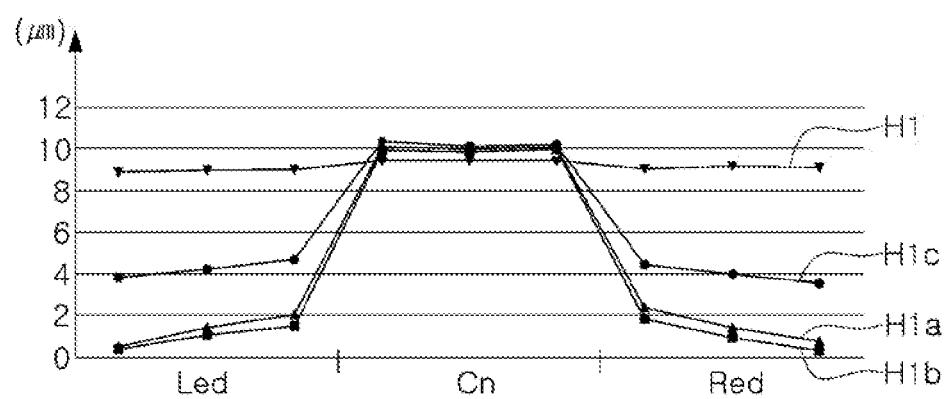
FIG. 8B is a graph showing a change in a first height H1 when a manufacturing process is changed.
Figure 8C:
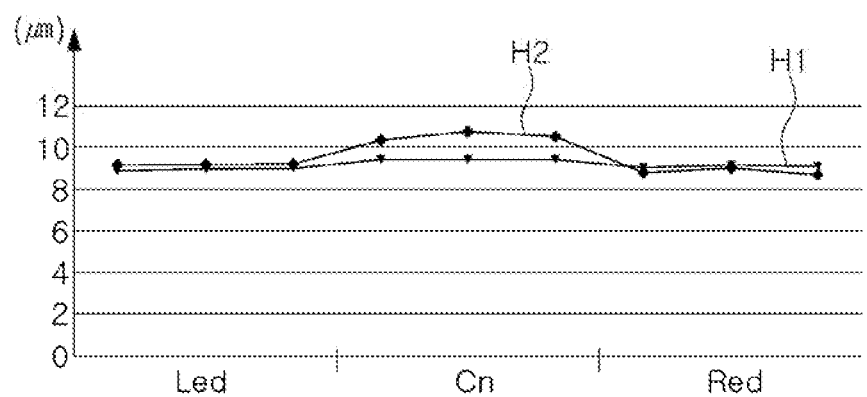
FIG. 8C is a graph showing a comparison of a change of a first height H1 and a change of a second height H2 in the semiconductor package of FIG. 8A.

FIG. 8A is a cross-sectional view of the semiconductor package 1000 completed through the manufacturing process shown in FIGS. 7A to 7D, FIG. 8B is a graph showing a change in a first height when the manufacturing process is changed, and FIG. 8C is a graph showing a comparison between a change in a first height H1 and a change in a second height H2 in the semiconductor package of FIG. 8A.

FIG. 8B is a graph showing a change in a first height in a central portion Cn and edge portions Led and Red of the semiconductor chip, when the semiconductor package 1000 of FIG. 8A is manufactured by using a heat-resistant film ('1500c in FIG. 7B) having the physical properties shown in Table 1 below, e.g., according to an Example (H1) and Comparative Examples 1-3 (H1a, H1b, and H1c).

FIG. 8C is a graph showing a change in a first height H1 and a second height H2 at the same time, when the semiconductor package 1000 of FIG. 8A is manufactured using a heat-resistant film ('1500c' in FIG. 7B) having the physical properties of the examples shown in Table 1 below.

Table 1 below shows the results of measuring physical properties of the foil and a maximum width of an outer portion 300pe of an adhesive film in the Example and Comparative Examples 1 to 3. The outer portion of the adhesive film 300 may be understood to be the same as that described in FIG. 1A and the like, and may be referred to as an NCF fillet. In Table 1 below, the physical properties exceeding a measurement range of a device for measuring each physical property were expressed as above (e.g., or more) or below (e.g., or less) a measurement limit.

TABLE 1

| Classifi-cation | Example (H1/H2) | Comparative Example 1 (H1a) | Comparative Example 2 (H1b) | Comparative Example 3 (H1c) |
|---|---|---|---|---|
| Tg (° C.) | About 160 | About 300 or more | About 300 or more | About 175 |
| Tm (° C.) | About 250 or more | About 300 or more | About 300 or more | About 300 or more |
| Modulus, 230° C. (GPa) | About 0.01 or less | About 2.3 | About 2.4 | About 0.2 |
| Elongation (%) | About 126 | About 77 | About 79 | About 93 |
| NCF fillet (μm) | About 38 | About 156 | About 68 | About 76 |

Referring to FIG. 8B, when the foil according to the Example of Table 1 was used, it may be seen that a first height H1 had a deviation of 1 μm or less in an entire section of a central portion Cn and edge portions Led and Red. The edge portion Red refers to a right edge portion and edge portion Led refers to a left edge portion with respect to the central portion Cn. On the other hand, when the foils of Comparative Example 1 (H1a), Comparative Example 2 (H1b), and Comparative Example 3 (H1c) of Table 1 were used, it may be seen that the deviation of first height in the central portion Cn and the edge portions Led and Red was about 7 μm to about 8 μm (in Comparative Examples 1 and 2), or about 5 μm to about 6 μm (in Comparative Example 3).

Referring to FIG. 8C, when the foil of the Example of Table 1 was used, it may be seen that deviation of a first height H1 at a relatively lower portion in a central portion Cn and edge portions Led and Red was smaller than deviation of a second height H2. For example, the deviation of the first height H1 was about 1 μm or less, and the deviation of the second height H2 was about 3 μm or less.

As described above, by using a foil satisfying physical properties having a glass transition temperature (Tg) of about 170° C. or less, a melting point (Tm) of about 240° C. or more, a Young's modulus of about 0.01 GPa or less at a high temperature (230° C.), and an elongation of about 100% or more, by performing a foil-lamination process and pressure-reflow process of covering the semiconductor chips on the wafer (see. 100W in FIG. 7A) with the foil, a fillet of the adhesive film 300 may be minimized and a gap between the base chip 100 and the semiconductor chip 200 may be uniformly formed to some extent. Accordingly, in the semiconductor package according to example embodiments, yield and productivity may be maximized.

By way of summation and review, in order to realize miniaturization, weight reduction, high performance, high capacity, and high reliability in a semiconductor package, a semiconductor package having a structure in which semiconductor chips are stacked in multiple stages has been considered.

One or more embodiments may provide a semiconductor package having improved reliability and yield.

As set forth above, according to example embodiments, a semiconductor package having improved reliability and yield may be provided by uniformly maintaining a gap between stacked semiconductor chips.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element. As used herein, the term "or" is not an exclusive term, e.g., "A or B" would include A, B, or A and B.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
  a base chip;
  a semiconductor chip having a lower surface on which connection pads are disposed, the semiconductor chip being mounted on an upper surface of the base chip;
  a plurality of bumps on the connection pads, the plurality of bumps electrically connecting the base chip to the semiconductor chip;
  an adhesive film between the base chip and the semiconductor chip, the adhesive film fixing the semiconductor chip to the base chip; and
  an encapsulant on the base chip, the encapsulant encapsulating the semiconductor chip,
  wherein:
  the semiconductor chip includes:
    a central portion spaced apart from the upper surface of the base chip by a first distance, and
    an edge portion spaced apart from the upper surface of the base chip by a second distance, the edge portion being positioned outside of the central portion, and
  a ratio of the second distance to the first distance is about 0.8 to about 1.0.

2. The semiconductor package as claimed in claim 1, wherein a difference between the first distance and the second distance is about 5 µm or less.

3. The semiconductor package as claimed in claim 1, wherein:
  the first distance is a maximum separation distance between the lower surface of the semiconductor chip and the upper surface of the base chip, and
  the second distance is a minimum separation distance between the lower surface of the semiconductor chip and the upper surface of the base chip.

4. The semiconductor package as claimed in claim 1, wherein the first distance and the second distance are each independently about 8 µm to about 10 µm.

5. The semiconductor package as claimed in claim 1, wherein the adhesive film includes:
  an inner portion overlapping the central portion and the edge portion of the semiconductor chip in a direction perpendicular to the upper surface of the base chip, and
  an outer portion protruding further than the edge portion of the semiconductor chip in a direction parallel to the upper surface of the base chip.

6. The semiconductor package as claimed in claim 5, wherein a maximum width of the outer portion is about 100 µm or less.

7. The semiconductor package as claimed in claim 5, wherein the outer portion has a tapered shape such that a width of a lower portion, adjacent to the upper surface of the base chip, is wider than that of an upper portion distal to the upper surface of the base chip.

8. The semiconductor package as claimed in claim 1, wherein the adhesive film covers at least a portion of a side surface of the semiconductor chip.

9. The semiconductor package as claimed in claim 1, wherein:
  the base chip is a buffer chip, and
  the semiconductor chip is a memory chip.

10. The semiconductor package as claimed in claim 1, wherein the encapsulant exposes at least a portion of an upper surface of the semiconductor chip.

11. A semiconductor package, comprising:
  a base chip;
  a first semiconductor chip mounted on the base chip;
  a second semiconductor chip mounted on the first semiconductor chip; and
  an adhesive material between the base chip and the first semiconductor chip and between the first semiconductor chip and the second semiconductor chip,
  wherein a difference between a first maximum separation distance and a first minimum separation distance between the base chip and the first semiconductor chip is less than a difference between a second maximum separation distance and a second minimum separation distance between the first semiconductor chip and the second semiconductor chip.

12. The semiconductor package as claimed in claim 11, wherein a ratio of the first minimum separation distance to the first maximum separation distance is about 0.8 to about 1.0.

13. The semiconductor package as claimed in claim 11, wherein a ratio of the second minimum separation distance to the second maximum separation distance is about 0.6 to about 0.8.

14. The semiconductor package as claimed in claim 11, wherein:
  the first maximum separation distance and the first minimum separation distance are each independently about 8 µm to about 10 µm, and
  the second maximum separation distance and the second minimum separation distance are each independently about 8 µm to about 12 µm.

15. The semiconductor package as claimed in claim 11, wherein:
  the adhesive material includes a lower adhesive portion between the base chip and the first semiconductor chip, and an upper adhesive portion between the first semiconductor chip and the second semiconductor chip, and
  the lower adhesive portion and the upper adhesive portion have an integral indistinguishable structure or an individual structure in which the lower adhesive portion and the upper adhesive portion are distinguished from each other at a boundary surface therebetween.

16. The semiconductor package as claimed in claim 11, further comprising a plurality of semiconductor chips stacked on the second semiconductor chip.

17. A semiconductor package, comprising:
  a package substrate;
  an interposer substrate on the package substrate; and
  at least one chip structure on the interposer substrate,
  wherein the at least one chip structure includes a base chip, a plurality of semiconductor chips on the base chip, and an adhesive film between the base chip and the plurality of semiconductor chips,
  wherein the adhesive film includes:
    an inner portion overlapping the plurality of semiconductor chips in a direction perpendicular to an upper surface of the interposer substrate, and an outer portion protruding further than side surfaces of the plurality of semiconductor chips in a direction parallel to the upper surface of the interposer substrate, and wherein a maximum width of the outer portion is about 50 µm or less in a direction perpendicular to the side surfaces of the plurality of semiconductor chips.

18. The semiconductor package as claimed in claim 17, wherein:

the plurality of semiconductor chips are stacked in a direction perpendicular to an upper surface of the base chip, and a difference between a maximum separation distance and a minimum separation distance between a lowermost semiconductor chip among the plurality of semiconductor chips and the base chip is about 1 µm or less.

19. The semiconductor package as claimed in claim 17, wherein the plurality of semiconductor chips are a plurality of memory chips connected to each other through a through silicon via.

20. The semiconductor package as claimed in claim 17, further comprising a logic chip on the interposer substrate, wherein the logic chip is electrically connected to the at least one chip structure through the interposer substrate.

* * * * *